(12) United States Patent
Huang

(10) Patent No.: US 12,571,831 B2
(45) Date of Patent: Mar. 10, 2026

(54) METHOD FOR INSPECTING ELECTRONIC COMPONENTS AND ELECTRONIC DEVICE

(71) Applicant: Innolux Corporation, Miaoli County (TW)

(72) Inventor: Zhi-Fu Huang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 202 days.

(21) Appl. No.: 18/458,175

(22) Filed: Aug. 30, 2023

(65) Prior Publication Data

US 2024/0103063 A1 Mar. 28, 2024

Related U.S. Application Data

(60) Provisional application No. 63/409,215, filed on Sep. 23, 2022.

(30) Foreign Application Priority Data

Jun. 5, 2023 (CN) .......................... 202310657347.2

(51) Int. Cl.
*G01R 31/26* (2020.01)
*G01R 1/04* (2006.01)
*G01R 31/66* (2020.01)

(52) U.S. Cl.
CPC ....... *G01R 31/2633* (2013.01); *G01R 1/0416* (2013.01); *G01R 31/66* (2020.01)

(58) Field of Classification Search
CPC .. G01R 31/2633; G01R 1/0416; G01R 31/66; G01R 27/02
See application file for complete search history.

(56) References Cited

U.S. PATENT DOCUMENTS

| | | | | |
|---|---|---|---|---|
| 9,823,290 | B2 * | 11/2017 | Fink | ..................... G01R 31/016 |
| 2007/0024550 | A1 * | 2/2007 | Chui | .................... G02B 26/001 |
| | | | | 345/84 |
| 2009/0079412 | A1 * | 3/2009 | Kuo | ..................... H10F 77/955 |
| | | | | 700/297 |

(Continued)

FOREIGN PATENT DOCUMENTS

| | | |
|---|---|---|
| CN | 106875879 | 5/2020 |
| TW | I588694 | 6/2017 |

*Primary Examiner* — Akm Zakaria
(74) *Attorney, Agent, or Firm* — JCIPRNET

(57) ABSTRACT

A method for inspecting electronic components and an electronic device are provided. The electronic device includes electronic elements, signal lines, an inspection structure, a substrate and a first driving element electrically connected to the signal lines. The signal lines include a first and a second signal lines. The electronic components include a first group of electronic components electrically connected to the first signal line and a second group of electronic components electrically connected to the second signal line. The first signal line has a first portion overlapping a first inspection region and a second portion overlapping the first driving element. The second signal line has a third portion overlapping a second inspection region and a fourth portion overlapping the first driving element. A distance between the second portion and the fourth portion is smaller than a distance between the first portion and the third portion.

16 Claims, 4 Drawing Sheets

(56) References Cited

U.S. PATENT DOCUMENTS

| | | | | |
|---|---|---|---|---|
| 2010/0277402 | A1* | 11/2010 | Miyazawa | ............. G09G 3/325 |
| | | | | 345/76 |
| 2014/0253142 | A1* | 9/2014 | Fink | ..................... G01R 31/016 |
| | | | | 324/538 |
| 2023/0282179 | A1* | 9/2023 | Lin | .......................... G09G 3/20 |
| | | | | 345/55 |

* cited by examiner

METHOD FOR INSPECTING ELECTRONIC COMPONENTS AND ELECTRONIC DEVICE

CROSS-REFERENCE TO RELATED APPLICATION

This application claims the priority benefits of the U.S. provisional application Ser. No. 63/409,215, filed on Sep. 23, 2022, and China application serial no. 202310657347.2, filed on Jun. 5, 2023. The entirety of each of the above-mentioned patent applications is hereby incorporated by reference herein and made a part of this specification.

BACKGROUND

Technical Field

The disclosure relates to a method for inspecting electronic components and an electronic device including an inspection structure.

Description of Related Art

At present, appearance inspection (for example, using an optical microscope) is applied to observe whether transferred electronic components are misplaced or shifted, but such inspection method is difficult to confirm a bonding status of each electronic component.

SUMMARY

The disclosure is directed to a method for inspecting electronic components and an electronic device, which helps to confirm or improve a bonding degree of the electronic components.

In an embodiment of the disclosure, the method for inspecting electronic components includes: providing a plurality of electronic components. The electronic components include a first group of electronic components arranged along a first direction and a second group of electronic components arranged along the first direction; providing a plurality of signal lines. The signal lines respectively extend in the first direction and include a first signal line and a second signal line, the first group of electronic components are electrically connected to the first signal line through a first group of switching components, and the second group of electronic components are electrically connected to the second signal line through a second group of switching components; in a first period of time, turning on the first group of switching components, so that the first group of electronic components are enabled to determine test results of the first group of electronic components; and in a second period of time, turning on the second group of switching components, so that the second group of electronic components are enabled to determine test results of the second group of electronic components.

In another embodiment of the disclosure, the electronic device includes a plurality of electronic components, a plurality of signal lines, an inspection structure, a substrate and a first driving element. The electronic components include a first group of electronic components arranged along a first direction and a second group of electronic components arranged along the first direction. The signal lines respectively extend in the first direction and include a first signal line and a second signal line. The first group of electronic components are electrically connected to the first signal line through a first group of switching components, and the second group of electronic components are electrically connected to the second signal line through a second group of switching components. The inspection structure is electrically connected to the first group of electronic components and the second group of electronic components. The electronic components are disposed on the substrate and located in an active region of the substrate. The inspection structure is disposed on the substrate and located in a peripheral region of the substrate. The first driving element is electrically connected to the signal lines, and is disposed on the substrate and located in the peripheral region of the substrate. The inspection structure includes a first inspection region and a second inspection region. The first signal line extends from the active region to the peripheral region and has a first portion overlapping the first inspection region and a second portion overlapping the first driving element. The second signal line extends from the active region to the peripheral region and has a third portion overlapping the second inspection region and a fourth portion overlapping the first driving element. A distance between the second portion and the fourth portion is smaller than a distance between the first portion and the third portion.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
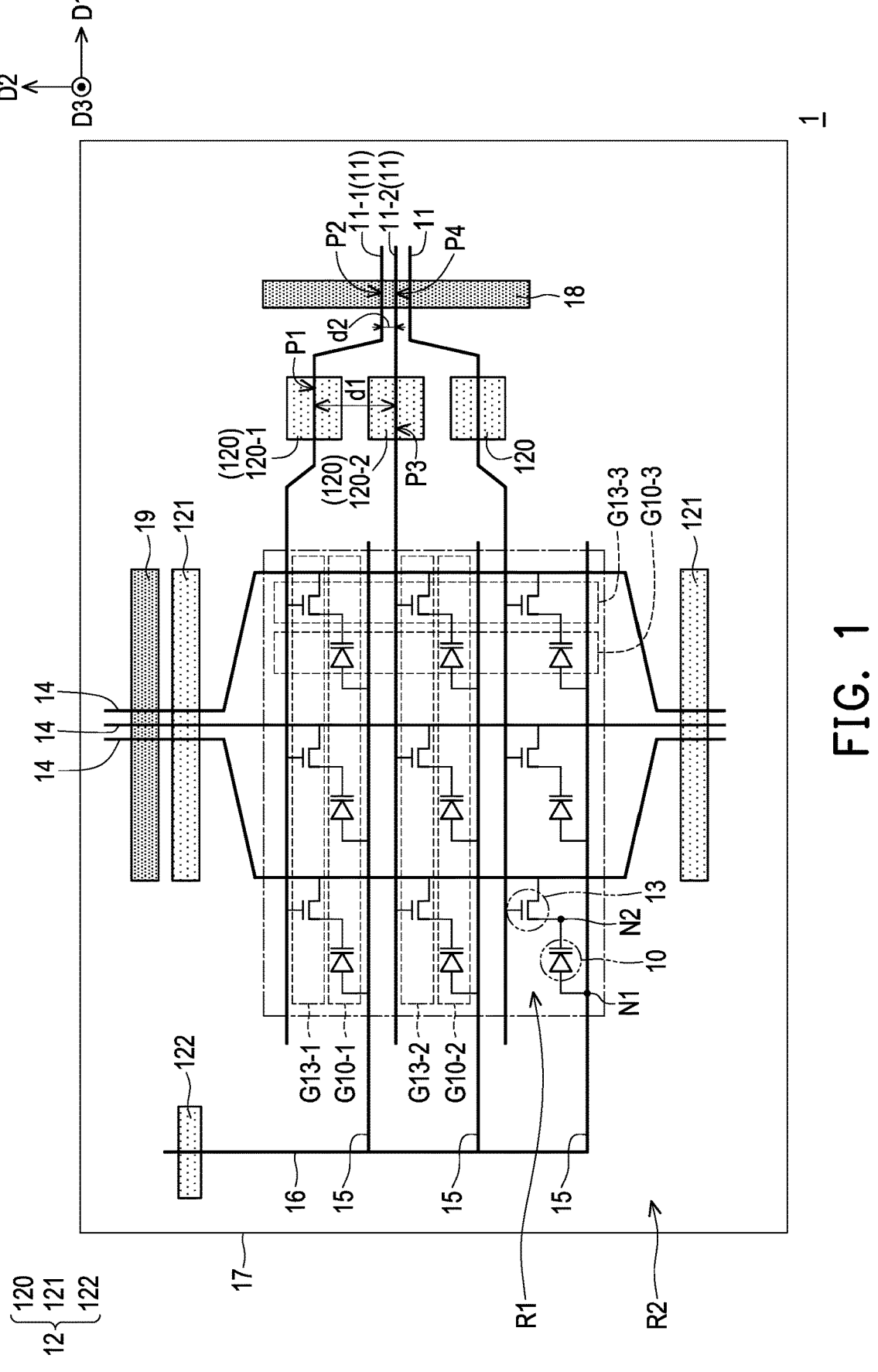
FIG. 1 to FIG. 3 are schematic top views of electronic devices according to various embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Throughout the disclosure and the appended claims, certain terms may be used to refer to particular components. Those skilled in the art should understand that electronic device manufacturers may refer to the same components by different names. This specification does not intend to distinguish between components that have the same function but have different names. In the following description and claims, words such as "containing" and "comprising" are open-ended words, so they should be interpreted as meaning "including but not limited to . . . ".

The directional terms mentioned in this specification, such as "up", "down", "front", "rear", "left", "right", etc., only refer to the directions of the drawings. Therefore, the used directional terminology is illustrative, and is not used for limiting the disclosure. In the drawings, various figures illustrate the general characteristics of methods, structures and/or materials used in particular embodiments. However, these drawings should not be construed to define or limit the scope or nature encompassed by these embodiments. For example, the relative sizes, thicknesses and positions of various layers, regions and/or structures may be reduced or exaggerated for clarity's sake.

One structure (or layer, element, substrate) described in the disclosure is located on/above another structure (or layer, element, substrate), which means that the two structures are adjacent and in direct connection, or means that the two structures are adjacent but in indirect connection. Indirect connection means that there is at least one intermediate structure (or intermediate layer, intermediate element, intermediate substrate, intermediate space) between the two structures, a lower surface of a structure is adjacent or directly connected to an upper surface of the intermediate structure, and an upper surface of the other structure is adjacent to or directly connected to a lower surface of the intermediate structure. The intermediary structure may be composed of a single-layer or multi-layer physical structure or non-physical structure, which is not limited by the disclosure. In the disclosure, when a certain structure is described to be "on" another structure, it means that the certain structure is "directly" on the another structure, or means that the certain structure is "indirectly" on the another structure, i.e., at least one structure is further clamped between the certain structure and the another structure.

The terms "about", "equal to", "equal" or "same", "substantially" or "approximately" are generally interpreted as being within 20% of a given value or range, or interpreted as being within 10%, 5%, 3%, 2%, 1%, or 0.5% of the given value or range.

The ordinal numbers used in the specification and claims, such as "first", "second", etc., are used to modify components, and do not imply and represent that the component or these components have any previous ordinal numbers, and do not represent a sequence of one component with another, or a sequence in a manufacturing method. The use of these ordinal numbers is only to make a clear distinction between one component with a certain name and another component with the same name. The same terms may not be used in the claims and the specification, and accordingly, a first component in the specification may be a second component in the claims.

The electrical connection or coupling described in this disclosure may refer to direct connection or indirect connection. In the case of direct connection, terminals of components on two circuits are directly connected or connected to each other by a conductor line segment, and in the case of indirect connection, there are switches, diodes, capacitors, inductors, resistors, other suitable components, or a combination of the above components between the terminals of the components on the two circuits, but the disclosure is not limited thereto.

In the disclosure, a thickness, length, width, and area may be measured by using an optical microscope (OM), and the thickness or width may be obtained by measuring a cross-sectional image in the electron microscope, but the disclosure is not limited thereto. In addition, there may be a certain error in any two values or directions used for comparison. In addition, the terms "equal to", "equal", "same", "substantially" or "approximately" mentioned in the disclosure usually represent within 10% of a given value or range. Moreover, the expressions "the given range is a first value to a second value", "the given range falls within a range of the first value to the second value" mean that the given range includes the first value, the second value, and other values there between. If a first direction is perpendicular to a second direction, an angle between the first direction and the second direction may be between 80 degrees and 100 degrees; and if the first direction is parallel to the second direction, the angle between the first direction and the second direction may be between 0 degree and 10 degrees.

It should be noted that in the following embodiments, features in multiple different embodiments may be substituted, reorganized, and mixed to complete other embodiments without departing from the spirit of the present disclosure. The features of the various embodiments may be mixed and matched arbitrarily as long as they do not violate or conflict with the spirit of the disclosure.

Unless otherwise defined, all terms (including technical and scientific terms) used herein have the same meanings as commonly understood by those skilled in the art to which this disclosure belongs. It is understandable that these terms, such as those defined in commonly used dictionaries, should be interpreted as having meaning consistent with the relevant technology and the background or context of this disclosure, and should not be interpreted in an idealized or excessively formal way, unless there is a special definition in the embodiment of the disclosure.

In the disclosure, the electronic device may include a display device, a backlight device, a radio frequency (RF) device, an antenna device, a sensing device, or a splicing device, but the disclosure is not limited thereto. The electronic device may be a bendable or flexible electronic device. The display device may be a non-self-luminous type display device or a self-luminous type display device. The RF device may include a frequency selective surface (FSS), a radio frequency filter (RF-Filter), a polarizer, a resonator or an antenna, etc. The antenna device may be a liquid crystal type antenna device or a non-liquid crystal type antenna device, and the sensing device may be a sensing device that senses capacitance, light, heat, or ultrasound, but the disclosure is not limited thereto. In the disclosure, the electronic device may include electronic components, and the electronic components may include passive components and active components, such as capacitors, resistors, inductors, diodes, transistors, etc. The diode may include a light-emitting diode or a photodiode. The light-emitting diode may include, for example, an organic light-emitting diode (OLED), a mini LED, a micro LED or a quantum dot LED, but the disclosure is not limited thereto. The splicing device may be, for example, a display splicing device or an RF splicing device, but the disclosure is not limited thereto. It should be noted that the electronic device may be any arrangement and combination of the foregoing, but the disclosure is not limited thereto.

Figure 2:
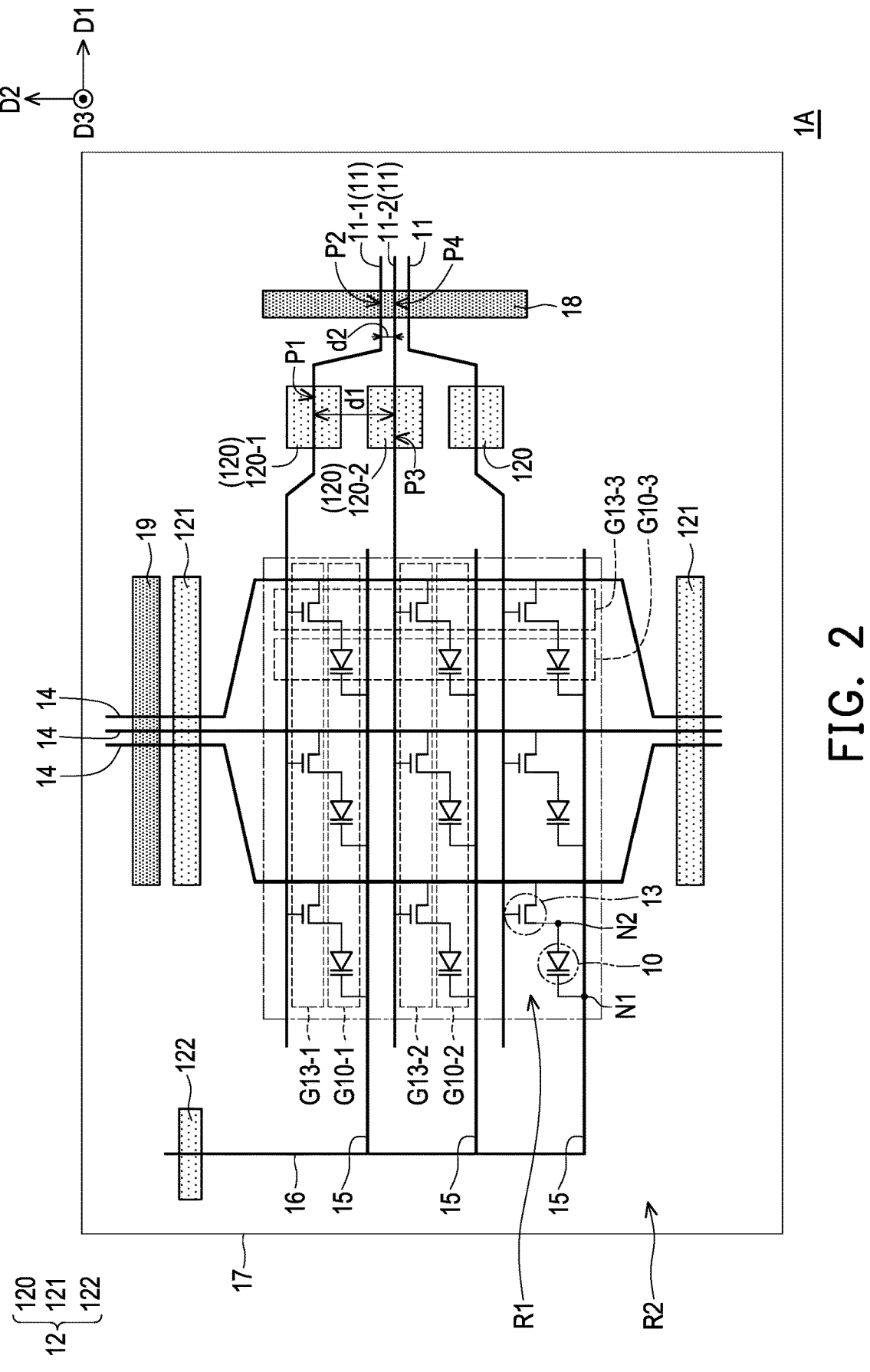
Figure 3:
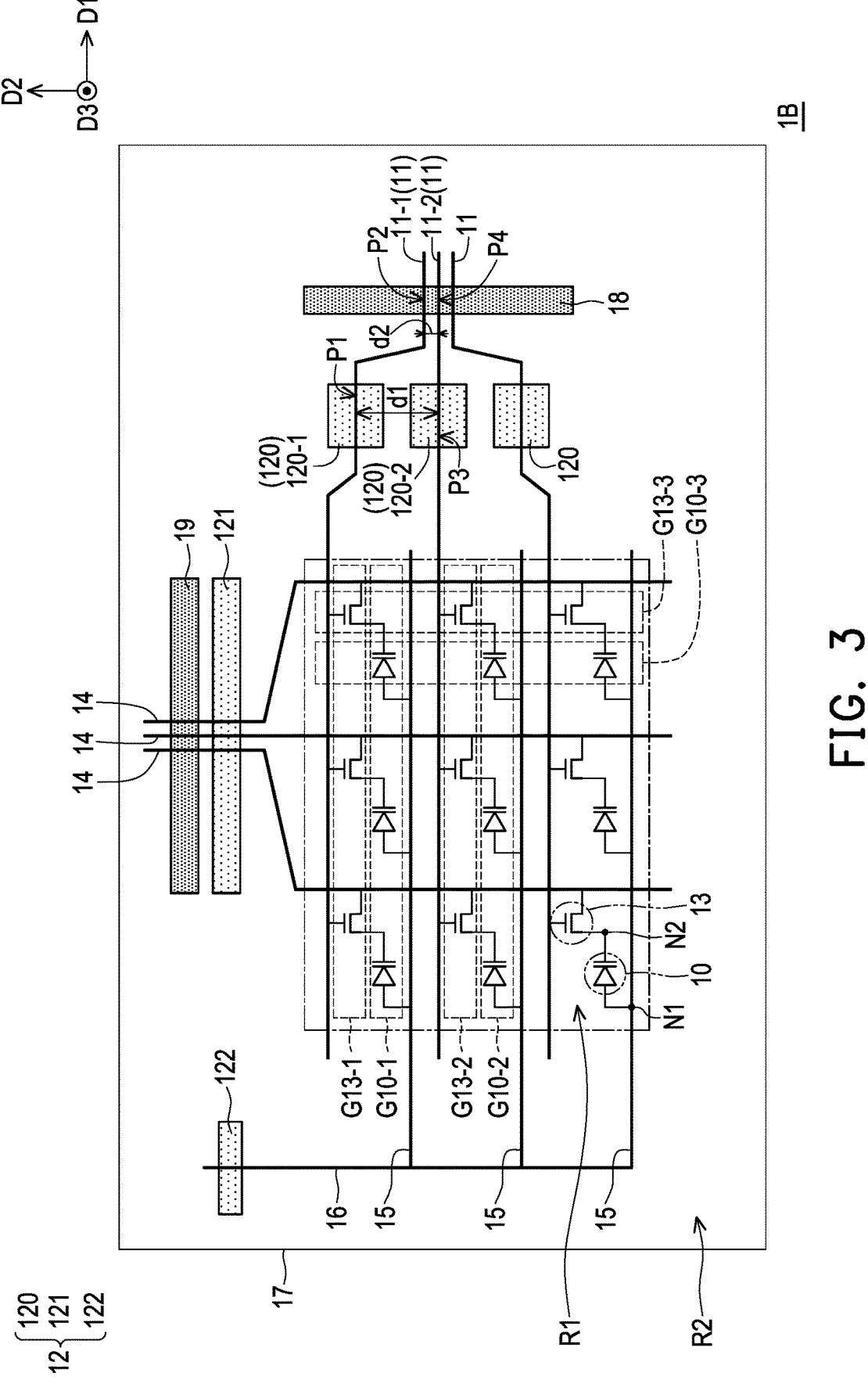
Figure 4:
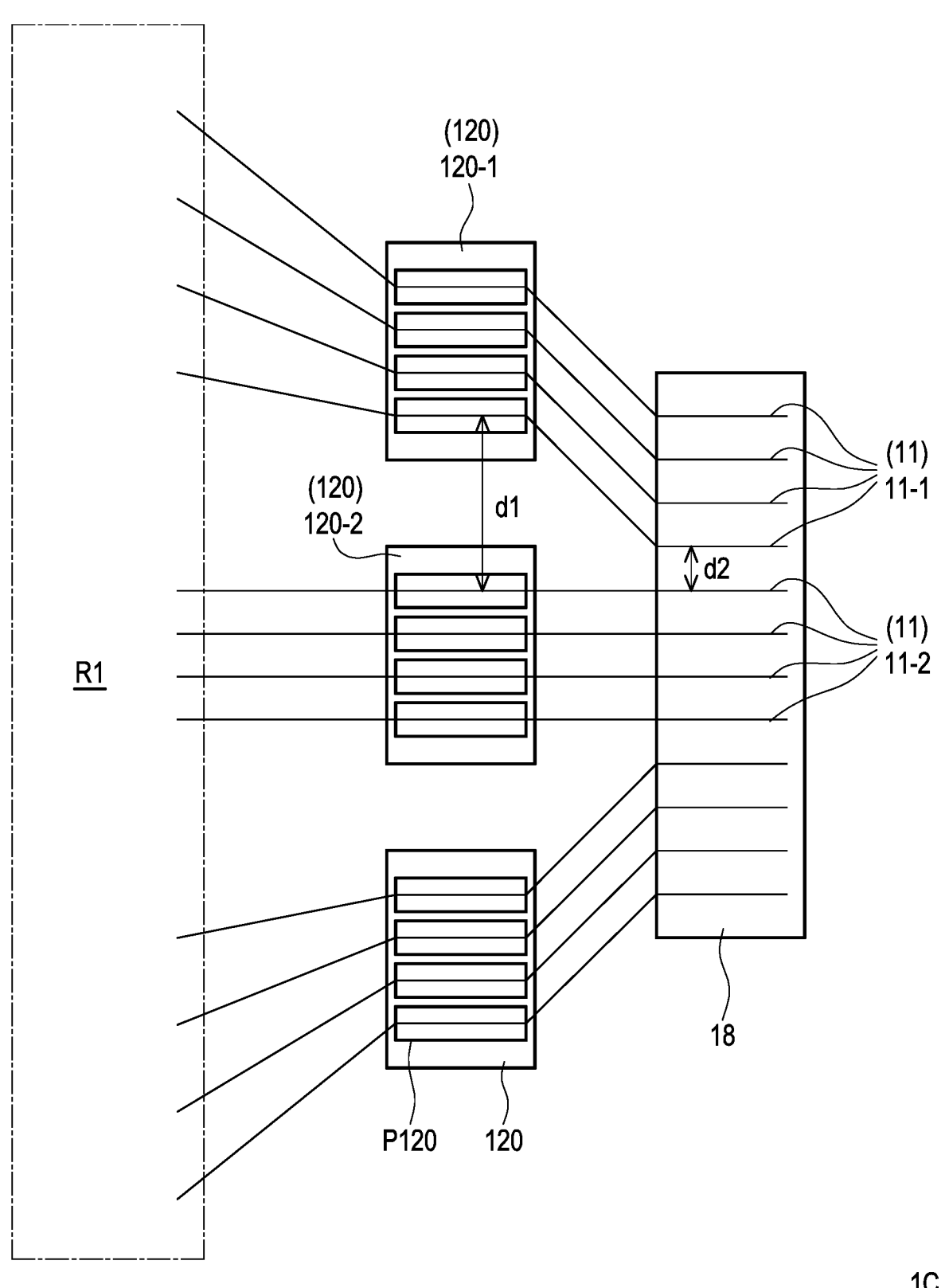
FIG. 4 is a schematic partial top view of an electronic device according to an embodiment of the disclosure.

FIG. 1 to FIG. 3 are schematic top views of electronic devices according to various embodiments of the disclosure. FIG. 4 is a schematic partial top view of an electronic device according to an embodiment of the disclosure.

Referring to FIG. 1, an electronic device 1 may include a plurality of electronic components 10, a plurality of signal lines 11 and an inspection structure 12. The electronic components 10 include a first group of electronic components G10-1 arranged along a first direction D1 and a second group of electronic components G10-2 arranged along the first direction D1. The signal lines 11 respectively extend in the first direction D1 and include a first signal line 11-1 and a second signal line 11-2, where the first group of electronic components G10-1 are electrically connected to the first signal line 11-1 through a first group of switching components G13-1, and the second group of electronic components G10-2 are electrically connected to the second signal line 11-2 through a second group of switching components G13-2. The inspection structure 12 is electrically connected to the first group of switching components G13-1 and the second group of switching components G13-2.

In detail, the electronic device 1 may be an antenna device, a display device, an illumination device or other types of electronic devices. According to different functions or uses of the electronic device 1, types of the electronic components 10 may be different. For example, the electronic components 10 may be electronic components that emit light when being powered on, so that a bonding status of each of the electronic components 10 may be determined through a lighting test. The electronic components that emit light after being powered on may include diodes, where power on may be, for example, to apply a forward bias to the electronic components 10. The diodes may include varactors, light-emitting diodes, photodiodes, or other types of diodes, without further limitation.

The electronic components 10 may be arranged in an array on a plane formed by the first direction D1 and a second direction D2. The second direction D2 is different from the first direction D1, and the second direction D2 may be perpendicular to the first direction D1, which is not limited by the disclosure.

FIG. 1 schematically illustrates nine electronic components 10, and the nine electronic components 10 are arranged in three horizontal rows and three vertical columns, where each horizontal row includes three electronic components 10 arranged along the first direction D1, and each vertical column includes three electronic components 10 arranged along the second direction D2. However, it should be understood that the number and arrangement of the electronic components 10 may be changed according to actual requirements, and are not limited to those shown in FIG. 1.

For the purpose of illustration, two horizontal rows and one vertical column formed by the electronic components 10 are schematically circled by dotted line frames in FIG. 1, and the electronic components 10 in the upper horizontal row are referred to as a first group of electronic components G10-1, the electronic components 10 in a lower horizontal row are referred to as a second group of electronic components 10-2, and the electronic components 10 in the vertical column are referred to as a third group of electronic components G10-3.

The signal lines 11 may be gate lines, and the signal lines 11 are arranged in the second direction D2. In some embodiments, the electronic device 1 may further include a plurality of switching components 13. The switching components 13 may be arranged in an array on the plane formed by the first direction D1 and the second direction D2.

FIG. 1 schematically illustrates nine switching components 13, and the nine switching components 13 are arranged in three horizontal rows and three vertical columns, where each horizontal row includes three switching components 13 arranged along the first direction D1, and each vertical column includes three switching components 13 arranged along the second direction D2. However, it should be understood that the number and arrangement of the switching components 13 may be changed according to actual requirements, and are not limited to those shown in FIG. 1.

For the purpose of illustration, two horizontal rows and one vertical column formed by the plurality of switching components 13 are schematically circled by dotted line frames in FIG. 1, and the switching components 13 in an upper horizontal row are referred to as a first group of switching components G13-1, the switching components 13 in a lower horizontal row are referred to as a second group of switching components 13-2, and the switching components 13 in the vertical column are referred to as a third group of switching components G13-3.

In a same horizontal row, the gates of the switching components 13 are electrically connected to the same signal line 11, and the drains of the switching components 13 are respectively electrically connected to second terminals N2 of different electronic components 10. In this way, the electronic components 10 in the same horizontal row may be electrically connected to a corresponding signal line 11 through the switching components 13 in the corresponding horizontal row. For example, the first group of electronic components G10-1 may be electrically connected to the first signal line 11-1 through the first group of switching components G13-1, and the second group of electronic components G10-2 may be electrically connected to the second signal line 11-2 through the second group of switching components G13-2.

The inspection structure 12 may include a plurality of inspection regions 120. The inspection regions 120 may be arranged in the second direction D2, and the signal lines 11 are electrically connected to the inspection regions 120, respectively. In detail, viewing from a top view direction, each signal line 11 may pass through one corresponding inspection region 120 and is electrically connected to a corresponding inspection pad (not shown in FIG. 1, referring to an inspection pad P120 of FIG. 4) in the inspection region 120. A number of the inspection pads in each inspection region 120 may be equal to a number of the signal lines 11 passing through the inspection region 120. For example, the first signal line 11-1 of the signal lines 11 may pass through a first inspection region 120-1 of the inspection regions 120 and is electrically connected to an inspection pad (not shown in FIG. 1) in the first inspection region 120-1, and the second signal line 11-2 in the signal lines 11 may pass through a second inspection region 120-2 in the inspection regions 120 and is electrically connected to an inspection pad (not shown in FIG. 1) in the second inspection region 120-2. In this way, the switching components 13 may be turned on by inputting electrical signals to the inspection pads 120.

According to different requirements, the electronic device 1 may further include other elements or film layers. For example, the electronic device 1 may further include multiple data lines 14. The data lines 14 respectively extend in the second direction D2, and the sources of the switching components 13 in the same vertical column may be electrically connected to s same data line 14. In this way, the electronic components 10 in the same vertical column may be electrically connected to a corresponding data line 14 via the switching components 13 in the corresponding vertical column. For example, the third group of electronic components G10-3 may be electrically connected to one data line 14 among the data lines 14 (such as the rightmost data line 14 in FIG. 1) via the third group of switching components G13-3.

The inspection structure 12 may further include an inspection region 121. The inspection region 121 is disposed adjacent to ends of the data lines 14, and the data lines 14 may pass through the inspection region 121 and are electrically connected to the inspection pads (not shown in FIG. 1) in the inspection region 121. The number of inspection pads in the inspection region 121 is, for example, equal to the number of the data lines 14. In some embodiments, as shown in FIG. 1, the inspection structure 12 may include two inspection regions 121, and the two inspection regions 121 may be respectively disposed adjacent to two opposite ends of the data lines 14. When the switching components 13 are turned on, by inputting a data voltage to the two inspection regions 121, the data voltage may be transmitted to the electronic components 10 through the data lines 14 and the switching components 13. By providing the data voltage from two opposite ends of the data lines 14, it helps to mitigate an IR drop problem of the data voltage, and may reduce the brightness difference caused by the IR drop problem, thereby helping to mitigate a situation of being misjudged as poor bonding due to insufficient brightness caused by the IR drop problem.

The electronic device 1 may further include a plurality of common electrode lines 15. The common electrode lines 15 respectively extend in the first direction D1 and are arranged in the second direction D2. The first terminals N1 of the electronic components 10 in the same horizontal row may be electrically connected to a same common electrode line 15.

The inspection structure 12 may further include an inspection region 122, and the inspection region 122 may be electrically connected to the common electrode lines 15. For example, the common electrode lines 15 may be electrically connected to an inspection pad (not shown in FIG. 1) in the inspection region 122 through a wire 16 extending along the second direction D2, but the disclosure is not limited thereto.

The electronic device 1 may further include a substrate 17, a first driving element 18 and a second driving element 19. The substrate 17 is used to carry elements or film layers. The substrate 17 may be a rigid substrate or a flexible substrate. A material of the substrate 17 includes, for example, glass, quartz, ceramics, sapphire or plastic, etc., but the disclosure is not limited thereto. The plastic may include polycarbonate (PC), polyimide (PI), polypropylene (PP), polyethylene terephthalate (PET), and other suitable flexible materials or a combination of the aforementioned materials, but the disclosure is not limited thereto.

The substrate 17 has an active region R1 and a peripheral region R2. The peripheral region R2 may be located on one or more sides of the active region R1. For example, the peripheral region R2 may surround the active region R1, but the disclosure is not limited thereto. For the convenience of identification, a boundary between the active region R1 and the peripheral region R2 is marked with a chain line in FIG. 1. However, it should be understood that design parameters such as a relative setting relationship or a proportion between the active region R1 and the peripheral region R2 may be changed according to actual needs, and are not limited to that shown in FIG. 1.

The electronic components 10 are disposed on the substrate 17 and located in the active region R1 of the substrate 17. The signal lines 11 are disposed on the substrate 17 and extend from the active region R1 to the peripheral region R2 and are partially overlapped with the inspection regions 120 and the first driving element 18 in the third direction D3 perpendicular to the first direction D1 and the second direction D2. The inspection structure 12 is disposed on the substrate 17 and located in the peripheral region R2. The switching components 13 are disposed on the substrate 17 and located in the active region R1. The common electrode lines 15 are disposed on the substrate 17 and extend from the active region R1 to the peripheral region R2. The wire 16 is disposed on the substrate 17 and located in the peripheral region R2 and is partially overlapped with the inspection region 122 in the third direction D3.

The first driving element 18 is disposed on the substrate 17 and located in the peripheral region R2, where the inspection regions 120 are located between the active region R1 and the first driving element 18. The first driving element 18 is, for example, a gate driving element and may include an integrated circuit (IC), a flexible printed circuit board (FPCB), a printed circuit board (PCB), a chip on glass (COG), a chip on film (COF), a chip on plastic (COP) or a gate on panel, but the disclosure is not limited thereto. In some embodiments, a number of the first driving elements 18 may be plural, and the first driving elements 18 may be respectively used to control the electronic components in different horizontal rows, and the first driving elements 18 may be located on one or more sides (such as the left and right sides, but the disclosure is not limited thereto) of the active region R1.

The second driving element 19 is disposed on the substrate 17 and located in the peripheral region R2. The two inspection regions 121 are located on two opposite sides of the active region R1, and one of the inspection regions 121 is located between the active region R1 and the second driving element 19. The second driving element 19 is, for example, a source driving element and may include an IC, an FPCB, a PCB, a COG, a COF or a COP, but the disclosure is not limited thereto.

The first driving element 18 and the second driving element 19 may be used to provide signals for controlling the electronic components 10 when the electronic device 1 is operated. In some embodiments, the wire 16 may further extend to the second driving element 19, and the wire 16 may electrically connect the common electrode lines 15 to the second driving element 19, so as to provide a common voltage to the common electrode lines 15 via the second driving element 19. Taking the electronic device 1 as an antenna device and the electronic components 10 as a plurality of varactors as an example, when the antenna is in operation, the first driving element 18 may sequentially provide switching signals to the signal lines 11, so as to turn on the switching components 13 in different horizontal rows at different periods of time, and the second driving element 19 may provide a reverse bias to the electronic components 10 through the data lines 14. Taking FIG. 1 as an example, a data voltage (such as a positive bias) may be input to the data lines 14 and a common voltage (such as a negative bias) may be input to the wire 16 and the common electrode lines 15 to control equivalent capacitances of the varactors, so that at least one of a resonant frequency, a phase and an amplitude of an electromagnetic wave is changed correspondingly, so as to control a direction of the electromagnetic wave or improve directivity of the antenna device.

Generally, when the electronic components 10 in the electronic device 1 are transferred to the substrate 17, poor bonding or dislocation may occur. Based on the characteristic that the electronic components 10 emit light after being powered on, it may be determined whether each of the electronic components 10 is well bonded through a lighting test. Taking the electronic components 10 as a plurality of varactors as an example, by turning on the switching components 13 and providing a forward bias to the electronic components 10, when the increase of the forward bias makes a depletion region in the varactor disappears, a large number of holes and electrons start to combine and emit infrared light with a wavelength of about 760 nm or more. An image of the electronic device 1 may be captured by an infrared light capturing device to find out the electronic component 10 with a poor bonding effect.

In some embodiments, a method for inspecting the electronic components 10 may include: providing the electronic components 10, where the electronic components 10 include a first group of electronic components G10-1 arranged along the first direction D1 and a second group of electronic components G10-2 arranged along the first direction D1; providing the signal lines 11, where the signal lines 11 respectively extend in the first direction D1 and include the first signal line 11-1 and the second signal line 11-2, the first group of electronic components G10-1 are electrically connected to the first signal line 11-1 through the first group of switching components G13-1, and the second group of electronic components G10-2 are electrically connected to the second signal line 11-2 through the second group of switching components G13-2; turning on the first group of switching components G13-1 in a first period of time to enable the first group of electronic components G10-1, so as to determine a test result of the first group of electronic components G10-1; and turning on the second group of switching component G13-2 in a second period of time to enable the second group of electronic components G10-2, so as to determine a test result of the second group of electronic components G10-2.

In detail, after the electronic components 10 are transferred to the substrate 17 and before the first driving element 18 and the second driving element 19 are configured, it may be determined whether each electronic component 10 in the electronic components 10 is well bonded, so as to opportunely perform a repairing procedure and/or improve yield. During the inspection, the inspection structure 12 (including the inspection regions 120, the inspection regions 121 and an inspection region 122) may be electrically connected to an external power supply device, so as to supply an electrical signal (such as a fixed voltage) provided by the external power supply device to the switching components 13 through the inspection pads in the inspection regions 120 and the signal lines 11, thereby turning on the switching components 13, and supply a data signal (such as a negative bias) provided by the external power supply device to the electronic components 10 through the inspection pads in the inspection regions 121 and the data lines 14, and supply a common signal (such as a positive bias) provided by the external power supply device to the electronic components 10 through the inspection pad in the inspection region 122, the wire 16 and the common electrode lines 15, so as to provide the forward bias to the electronic components 10, thereby enabling the electronic components 10 to make the electronic components emitting light. Whether the electronic components 12 are poorly bonded may be determined by a light emitting condition of the electronic components 12, which is helpful for opportunely performing repairing and improving the yield. On the other hand, after the inspection (lighting test), the external power supply device may be removed, and the first driving element 18 and the second driving element 19 may be configured to provide signals (such as gate drive signals, source drive signals and common voltages, etc.) for controlling the electronic components 10 when the electronic device 1 is operated.

During the inspection, considering the IR drop problem of the data voltage due to increase of a resistance value, the electronic components 10 may be subjected to partitioned (grouped) lighting to reduce the brightness difference caused by the IR drop problem, which helps to mitigate the situation of being misjudged as poor bonding due to insufficient brightness caused by the IR drop problem. Taking FIG. 1 as an example, electrical signals may be sequentially provided to the signal lines 11 in order to sequentially turn on the switching components 13 in different groups. In the case that the switching components 13 are turned on, the data voltage may be provided to the data lines 14, and the common voltage may be provided to the common electrode lines 15, for example, the common voltage and the data voltage may be respectively provided to the first terminal N1 and the second terminal N2 of the electronic component 10. In the case that an anode of the electronic component 10 is electrically connected to the common electrode line 15 and a cathode of the electronic component 10 is electrically connected to the data line 14, a positive bias may be provided to the inspection region 122, and a negative bias may be provided to the inspection regions 121.

For example, in the first period of time, an electric signal is provided to the first signal line 11-1 through the first inspection region 120-1 to turn on the first group of switching components G13-1, and within the first period of time, a forward bias is provided to the first group of electronic components G10-1 (a common voltage and a data voltage are respectively provided to the first terminal N1 and the second terminal N2 of each electronic component 10 in the first group of electronic components G10-1), so that the first group of electronic components G10-1 emit light. In the second period of time, an electric signal is provided to the second signal line 11-2 through the second inspection region 120-2 to turn on the second group of switching components G13-2, and within the second period of time, a forward bias is provided to the second group of electronic components G10-2 (the common voltage and the data voltage are respectively provided to the first terminal N1 and the second terminal N2 of each electronic component 10 in the second group of electronic components G10-2), so that the second group of electronic components G10-2 emit light. Similarly, in a third period of time, an electric signal is provided to the lowermost signal line 11 in FIG. 1 through a third inspection pad (such as the lowermost inspection region 120 in FIG. 1), so as to turn on the switching components 13 in the lowermost horizontal row, and in the third period of time, the forward bias is provided to the electronic components 10 in the lowermost horizontal row, so that these electronic components 10 emit light. If the electronic component 10 fails to emit light smoothly or a brightness thereof is below a threshold, a repairing procedure is further carried out. In this way, it helps to improve a bonding degree of the electronic components 10 in the electronic device 1.

In addition to performing the partitioned (grouped) lighting test, by providing the data voltage at each period of time (for example, at the first period of time, second period of time or third period of time) from two opposite ends of the data line 14 to the electronic components 10 of each vertical column (such as the third group of electronic components G10-3), it helps to mitigate the IR drop problem of the data voltage, and reduce the brightness difference caused by the IR drop problem, thereby helping to mitigate the situation of being misjudged as poor bonding due to insufficient brightness caused by the IR drop problem. However, the disclosure is not limited thereto. In other embodiments, a single end of the data line 14 (for example, the lower inspection region 121 in FIG. 1 may be omitted) may provide the data voltage to the electronic components 10 of each vertical column.

Furthermore, considering an alignment accuracy of a test pad fixture, a distance between the two adjacent signal lines 11 in the two adjacent inspection regions 120 at positions overlapped with the inspection regions 120 may be greater than a distance between the two adjacent signal lines 11 at positions overlapped with the first driving element 18 (or the second driving element 19), so as to reduce a manufacturing difficulty of the test pad fixture. Taking FIG. 1 as an example, the first signal line 11-1 has a first portion P1 overlapping the first inspection region 120-1 and a second portion P2 overlapping the first driving element 18, and the second signal line 11-2 has a third portion P3 overlapping the second inspection region 120-2 and a fourth portion P4 overlapping the first driving element 18, where a distance d2 between the second portion P2 and the fourth portion P4 is smaller than a distance d1 between the first portion P1 and the third portion P3. In some embodiments, the distance d1 is, for example, 1 mm to 5 mm, and the distance d2 is, for example, 5 μm to 20 μm, but the disclosure is not limited thereto. By increasing the distance d1 between the two adjacent signal lines 11 in the two adjacent inspection regions 120, it helps the lighting test and/or reduce the mutual influence (such as short circuit) of the two adjacent inspection regions 120.

Referring to FIG. 2, a main difference between an electronic device 1A and the electronic device 1 of FIG. 1 is that the anode of electronic component 10 is electrically connected to the data line 14 through the drain of switching component 13, and the cathode of electronic component 10 is electrically connected to the common electrode line 15. Therefore, when the lighting test is performed, a positive bias is provided to the inspection region 121, and a negative bias is provided to the inspection regions 122 to provide a forward bias to the electronic components 10.

Referring to FIG. 3, a main difference between an electronic device 1B and the electronic device 1 in FIG. 1 is that the electronic device 1B does not include the lower inspection region 121 in FIG. 1, i.e., the data voltage is provided to the electronic components 10 of each vertical column by a single end of the data line 14. Although FIG. 3 is improved under the framework of FIG. 1, it should be understood that the electronic device 1A of FIG. 2 may also be changed as above, which will not be repeated below.

In the embodiments shown in FIG. 1 to FIG. 3, by replacing the aforementioned partitioned (grouped) lighting test by partitioned (grouped) voltage modulation, the IR drop problem may be mitigated. For example, a larger electrical signal may be provided to the signal line 11 farther away from the inspection region 121, and a smaller electrical signal may be provided to the signal line 11 (such as the first signal line 11-1) closer to the inspection region 121, so as to reduce the brightness difference caused by the IR drop problem, which in turn helps to mitigate the situation of being misjudged as poor bonding due to insufficient brightness caused by the IR drop problem. For example, during the lighting test, if the three signal lines 11 arranged from top to bottom are respectively provided with an electrical signal (voltage) V1, an electrical signal (voltage) V2, and an electrical signal (voltage) V3, a design of the electrical signal V1<the electrical signal V2<the electrical signal V3 may be used to mitigate the situation of being misjudged as poor bonding due to insufficient brightness caused by the IR drop problem. On the other hand, it is also possible to replace the partitioned (grouped) voltage modulation by partitioned (grouped) threshold setting, so as to mitigate the situation of being misjudged as poor bonding due to insufficient brightness caused by the IR drop problem. For example, during the lighting test, if the signal lines 11 are provided with the same electrical signal, a brightness threshold of the uppermost group of electronic components 13 (such as the first group of electronic components G13-1) may be set higher than a brightness threshold of the middle group of electronic components 13 (such as the second group of electronic components G13-2), and the brightness threshold of the middle group of electronic components 13 is set to be higher than a brightness threshold of the bottom group of electronic components 13, so as to mitigate the situation of being misjudged as poor bonding due to insufficient brightness caused by the IR drop problem.

Although any group of electronic components in the embodiments of FIG. 1 to FIG. 3 include a single horizontal row or a single vertical column, the disclosure is not limited thereto. In other embodiments, each group of electronic components may include a plurality of horizontal rows or a plurality of vertical columns, and the number of the horizontal rows or the vertical columns in each group of electronic components may be determined according to an actual design. Namely, the number of the horizontal rows in different groups of electronic components may be the same or different; and the number of the vertical columns in different groups of electronic components may be the same or different.

Taking an electronic device 1C in FIG. 4 as an example, each group of electronic components may include electronic components (not shown in FIG. 4) of a plurality of (such as four) horizontal rows, and correspondingly, each group of switching components may include switching components (not shown in FIG. 4) of a plurality of (such as four) horizontal rows. In each group of electronic components, the electronic components of the (such as four) horizontal rows may be respectively connected to the corresponding plurality of (such as four) signal lines 11 (such as four first signal lines 11-1 or four second signal lines 11-2) via the switching components of the corresponding plurality of (such as four) horizontal rows. Moreover, the plurality of (such as four) signal lines 11 may pass through a corresponding inspection region 120 and are electrically connected to corresponding plurality of (such as four) inspection pads P120 in the inspection region 120. The number of the inspection pads P120 in the inspection region 120 is, for example, the same as the number of the electrically connected signal lines 11.

When performing partitioned (grouped) lighting tests, different groups of electronic components may be lighted in sequence, for example, the top group of electronic components (for example, including the electronic components of four horizontal rows) may be lighted first, and then the middle group of electronic components (for example, including the electronic components of four horizontal rows) may be lighted, and finally the bottom group of electronic components (for example, including the electronic components of four horizontal rows) may be lighted; and the electronic components of the horizontal rows in the same group may be lighted simultaneously or sequentially.

In addition, under the framework of partitioned (grouped) voltage modulation, different inspection regions 120 may be provided with different electrical signals, and multiple (such as four) signal lines 11 corresponding to the same inspection region 120 may be provided with the same electrical signal. For example, the three inspection regions 120 arranged from top to bottom may be respectively provided with the electrical signal (voltage) V1, the electrical signal (voltage) V2, and the electrical signal (voltage) V3, and the design of the electrical signal V1<the electrical signal V2<the electrical signal V3 may be used to mitigate the situation of being misjudged as poor bonding due to insufficient brightness caused by the IR drop problem.

Moreover, under the framework of partitioned (grouped) threshold setting, different groups of electronic components corresponding to different inspection regions 120 may be provided with the same electrical signal, and a brightness threshold of the uppermost group of electronic components may be set to be higher than a brightness threshold of the middle group of electronic components 13, and the brightness threshold of the middle group of electronic components may be set higher than a brightness threshold of the lowermost group of electronic components, so as to mitigate the situation of being misjudged as poor bonding due to insufficient brightness caused by the IR drop problem.

As described above, after the lighting test, the external power supply device may be removed, and the gate driving element (the first driving element 18 shown in FIG. 1 to FIG. 3) and the source driving element (the second driving element 19 shown in FIG. 1 to FIG. 3) are configured to provide signals (such as a gate driving signal, a data voltage, a common voltage, etc.) for controlling the electronic components when the electronic device 1C operates. When the electronic device 1C operates, the gate driving signal provided by the first driving element may be sequentially provided to multiple (such as twelve) signal lines 11, so as to turn on the switching components of different horizontal rows at different periods of time, and the data voltage provided by the second driving element may be provided to the electronic components through the data lines, and the common voltage provided by the second driving element may be provided to the electronic components through the common electrode lines.

FIG. 4 schematically illustrates a situation in which the signal lines 11 and the inspection pads P120 are partitioned (or grouped). However, although not shown in figures, it should be understood that the data lines and the inspection pads electrically connected thereto may also be partitioned (or grouped) according to actual needs; under such framework, the number of the inspection regions 121 disposed on the same side of the active region R1 may be plural, where the inspection regions 121 disposed on the same side of the active region R1 are arranged, for example, along the first direction D1.

In summary, in the embodiments of the disclosure, a bonding degree of the electronic components may be confirmed or improved through the lighting test. In some embodiments, it is also possible to mitigate the situation of being misjudged as poor bonding due to insufficient brightness caused by the IR drop problem through partitioned lighting test, partitioned voltage modulation, or bilateral data voltage supply.

The above embodiments are only used to illustrate the technical solutions of the disclosure, and are not used for limitation; although the disclosure has been described in detail with reference to the foregoing embodiments, those with ordinary knowledge in the technical field should understand that: they may still make modifications to the technical solutions recorded in the aforementioned embodiments, or make equivalent replacement on some or all of the technical features; and these modifications or replacements do not make the essence of the corresponding technical solutions depart from the scope of the technical solutions of the embodiments disclosed in the disclosure.

Although the embodiments of the disclosure and their advantages have been disclosed above, it should be understood that any person with ordinary knowledge in the technical field may make changes, substitutions and modifications without departing from the spirit and scope of the disclosure, and the features between the various embodiments may be arbitrarily mixed and replaced to form other new embodiments. In addition, a protection scope of the disclosure is not limited to processes, machines, fabrications, material compositions, devices, methods and steps in the specific embodiments described in the specification, and anyone with ordinary knowledge in the technical field may understand the current or future developed processes, machines, fabrications, material compositions, devices, methods and steps from the content disclosed in the disclosure, as long as substantially the same function may be performed or substantially the same result may be obtained in the embodiments described herein. Therefore, the protection scope of the disclosure includes the above-mentioned processes, machine, fabrications, material compositions, devices, methods and steps. In addition, each claim constitutes an individual embodiment, and the protection scope of the disclosure also includes a combination of each claim and the embodiments. The protection scope of the disclosure should be defined by the scope of the attached claims.

What is claimed is:

1. A method for inspecting electronic components, comprising:

providing a plurality of electronic components, wherein the electronic components comprise a first group of electronic components arranged along a first direction and a second group of electronic components arranged along the first direction;

providing a plurality of signal lines, wherein the signal lines respectively extend in the first direction and comprise a first signal line and a second signal line, the first group of electronic components are electrically connected to the first signal line through a first group of switching components, and the second group of electronic components are electrically connected to the second signal line through a second group of switching components;

turning on, in a first period of time, the first group of switching components, so that the first group of electronic components are enabled to determine test results of the first group of electronic components; and turning on, in a second period of time, the second group of switching components, so that the second group of electronic components are enabled to determine test results of the second group of electronic components, wherein electronic components among the first group of electronic components and switching components among the first group of switching components are arranged in a one-to-one relationship, and electronic components among the second group of electronic components and switching components among the second group of switching components are arranged in a one-to-one relationship, wherein the method for inspecting electronic components further comprises:

providing a plurality of data lines extending respectively in a second direction different from the first direction; and providing an inspection structure comprising an inspection region, the inspection region is located between a driving element and an active region, the data lines extend from the active region to a peripheral region, and the data lines pass through the inspection region and are electrically connected to the driving element, wherein the electronic components further comprise a third group of electronic components arranged along the second direction, the third group of electronic components are electrically connected to one data line in the data lines, and the inspection structure is configured to provide a data voltage from two opposite ends of the data line to the third group of electronic components.

2. The method for inspecting electronic components according to claim 1, wherein in the first period of time, turning on the first group of switching components, so that the first group of electronic components emit light.

3. The method for inspecting electronic components according to claim 1, wherein in the first period of time, providing a forward bias to the first group of electronic components.

15 16

4. The method for inspecting electronic components according to claim 1, wherein in the first period of time, providing a common voltage and a data voltage respectively to a first terminal and a second terminal of one electronic component in the first group of electronic components.

5. The method for inspecting electronic components according to claim 1, wherein the electronic components are a plurality of diodes.

6. An electronic device, comprising:

a plurality of electronic components, comprising a first group of electronic components arranged along a first direction and a second group of electronic components arranged along the first direction;

a plurality of signal lines, respectively extending in the first direction and comprise a first signal line and a second signal line, wherein the first group of electronic components are electrically connected to the first signal line through a first group of switching components, and the second group of electronic components are electrically connected to the second signal line through a second group of switching components;

an inspection structure, electrically connected to the first group of electronic components and the second group of electronic components;

a substrate, comprising an active region and a peripheral region, wherein the electronic components are disposed on the substrate within the active region, and the inspection structure is disposed on the substrate within the peripheral region; and a first driving element, electrically connected to the signal lines, disposed on the substrate within the peripheral region, wherein the inspection structure comprises a first inspection region and a second inspection region, wherein the first signal line extends from the active region to the peripheral region and comprises a first portion overlapping the first inspection region and a second portion overlapping the first driving element, the second signal line extends from the active region to the peripheral region and comprises a third portion overlapping the second inspection region and a fourth portion overlapping the first driving element, a distance between the second portion and the fourth portion is smaller than a distance between the first portion and the third portion, wherein electronic components among the first group of electronic components and switching components among the first group of switching components are arranged in a one-to-one relationship, and electronic components among the second group of electronic components and switching components among the second group of switching components are arranged in a one-to-one relationship, wherein the electronic device further comprises a plurality of data lines extending respectively in a second direction different from the first direction, wherein the electronic components further comprise a third group of electronic components arranged along the second direction, the third group of electronic components are electrically connected to one data line in the data lines, and the inspection structure is configured to provide a data voltage from two opposite ends of the data line to the third group of electronic components, wherein the inspection structure further comprises a third inspection region, and the electronic device further comprises a second driving element, the third inspection region is located between the second driving element and an active region, the data lines extend from the active region to a peripheral region, and the data lines pass through the third inspection region and are electrically connected to the second driving element.

7. The electronic device according to claim 6, wherein the inspection structure is configured to provide a common voltage to a first terminal of one electronic component in the first group of electronic components and provide a data voltage to a second terminal of the electronic component.

8. The electronic device according to claim 6, wherein the electronic components are a plurality of diodes.

9. The electronic device according to claim 6, wherein the first inspection region and the second inspection region are located between the first driving element and the active region.

10. A method for inspecting electronic components, comprising:

providing a plurality of electronic components, wherein the electronic components comprise a first group of electronic components arranged along a first direction and a second group of electronic components arranged along the first direction;

providing a plurality of signal lines, wherein the signal lines respectively extend in the first direction and comprise a first signal line and a second signal line, the first group of electronic components are electrically connected to the first signal line through a first group of switching components, and the second group of electronic components are electrically connected to the second signal line through a second group of switching components;

providing a first electrical signal to the first signal line to turn on the first group of switching components, so that the first group of electronic components are enabled to determine test results of the first group of electronic components; and providing a second electrical signal different from the first electrical signal to the second signal line to turn on the second group of switching components, so that the second group of electronic components are enabled to determine test results of the second group of electronic components, wherein electronic components among the first group of electronic components and switching components among the first group of switching components are arranged in a one-to-one relationship, and electronic components among the second group of electronic components and switching components among the second group of switching components are arranged in a one-to-one relationship, wherein the method for inspecting electronic components further comprises:

providing a plurality of data lines extending respectively in a second direction different from the first direction; and providing an inspection structure comprising an inspection region, the inspection region is located between a driving element and an active region, the data lines extend from the active region to a peripheral region, and the data lines pass through the inspection region and are electrically connected to the driving element, wherein the electronic components further comprise a third group of electronic components arranged along the second direction, the third group of electronic components are electrically connected to one data line in the data lines, and the inspection structure is configured to provide a data voltage from two opposite ends of the data line to the third group of electronic components.

11. The method for inspecting electronic components according to claim 10, wherein the first electrical signal is smaller than the second electrical signal.

12. The method for inspecting electronic components according to claim 10, wherein the first electrical signal and the second electrical signal are provided simultaneously.

13. The method for inspecting electronic components according to claim 10, wherein enabling the first group of electronic components and the second group of electronic components comprises making the first group of electronic components and the second group of electronic components to emit light.

14. The method for inspecting electronic components according to claim 10, wherein enabling the first group of electronic components and the second group of electronic components comprises providing a forward bias to the first group of electronic components and the second group of electronic components.

15. The method for inspecting electronic components according to claim 10, wherein enabling the first group of electronic components and the second group of electronic components comprises respectively providing a common voltage and a data voltage to a first terminal and a second terminal of one electronic component in the first group of electronic components and the second group of electronic components.

16. The method for inspecting electronic components according to claim 10, wherein the electronic components are a plurality of diodes.

* * * * *